United States Patent [19]

Bonhomme

[11] 4,152,037

[45] May 1, 1979

[54] SEPARABLE ELECTRICAL CONNECTION DEVICES

[76] Inventor: Francois R. Bonhomme, 6, Parc de Béarn, Saint-Cloud, France, 92210

[21] Appl. No.: 834,394

[22] Filed: Sep. 19, 1977

[30] Foreign Application Priority Data

Sep. 29, 1976 [FR] France ................................ 76 29208

[51] Int. Cl.[2] ......................... H01R 13/54; H05K 1/12

[52] U.S. Cl. ............................. 339/75 MP; 339/17 L; 339/176 MP

[58] Field of Search ........... 339/17 L, 17 LC, 75 MP, 339/91 R, 176 MP

[56] References Cited

U.S. PATENT DOCUMENTS

| | | | |
|---|---|---|---|
| 3,587,031 | 6/1971 | Flavin et al. | 339/75 MP |
| 3,636,499 | 1/1972 | Winklebleck | 339/75 MP |
| 3,789,345 | 1/1974 | Reimer et al. | 339/75MP |
| 3,905,670 | 9/1975 | Anhalt et al. | 339/75 MP |

*Primary Examiner*—Roy Lake
*Assistant Examiner*—E. F. Desmond

[57] ABSTRACT

The invention is concerned with separable electric connection devices of the kind comprising two rigid supports fitting one inside the other, e.g. a printed circuit board and a connector therefor, one support carrying at least one primary contact member and the other carrying at least one resilient secondary contact member the free end of which is movable in a direction fixed relative to its support, and mechanical means for displacing one support relative to the other in the said direction after the supports have been fitted together, to make contact between the primary and secondary contact members. In the device of the invention the mechanical means is adapted to effect such a movement in the said direction followed by a supplementary movement in a direction perpendicular to the said direction which provides a self-cleaning action on the contacts.

3 Claims, 13 Drawing Figures

SEPARABLE ELECTRICAL CONNECTION DEVICES

Figure 1:
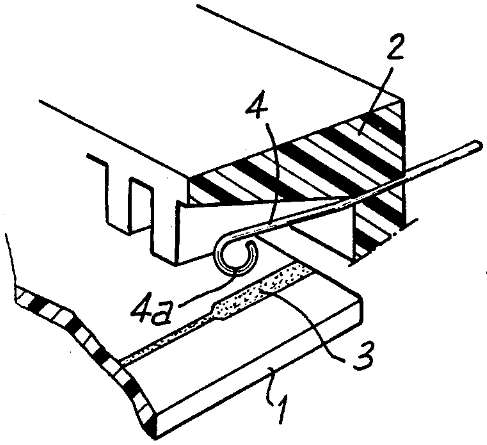

This invention relates to separable electrical connection devices.

More particularly the invention relates to separable electrical connection devices comprising two rigid supports having guide surfaces enabling the supports to be introduced one inside the other and to be extracted one from the other, one of the supports carrying at least one primary contact member while the other carries at least one resilient secondary contact member one end of which is free for displacement substantially in a direction which is fixed in relation to its support and is adapted to cooperate with the or one of the primary contact members of the other support, and mechanical means for displacing one of the supports relative to the other, parallel to the said direction, while the other support is held fixed, after the supports have been introduced one inside the other.

The invention relates more particularly, but not exclusively, to connection devices for printed circuit boards, each board then constituting a support with non-deformable primary contact members. In this specification, the expressions "primary" and "secondary" have been used simply to distinguish the two contact members or groups of contact members from one another and not to give a greater importance to one than the other.

Such a device renders it possible to solve the problem of "opening" the resilient secondary contact members just before and during the introduction of the supports one inside the other, and just before and during the extraction of the supports one in relation to the other, that is to say in removing the primary contact members from the volume swept by the free ends of the resilient contact members so as to render practically zero the force necessary for the introduction and extraction and to relieve the protective coverings of the primary and secondary contact members from any wear by friction. Of course, once the two supports have been fully introduced one into the other, the said mechanical means "close" the resilient contact members, that is to say cause their free ends to bear resiliently against the primary contact members with a force which depends on the mechanical characteristics of the resilient contact members and on the amplitude of the deformation imposed on these by the mechanical means. Nevertheless, since the mutual displacement of the supports is parallel to the direction in which the free end of the or each resilient contact member is displaced, this free end comes to bear against the corresponding primary contact member without brushing the latter locally, that is to say without being able to remove by friction the insulating dust which may have settled on the active surfaces of the contact members. Such dust is liable to prevent the passage of currents of low intensity.

The object of the invention is to overcome this disadvantage.

According to this invention, there is provided a separable electrical connection device of the kind set forth above, in which the said mechanical means are adapted to effect, after introduction of one support within the other, a first movement of the support to be displaced, parallel to the said direction and directed in the sense which affects engagement between active surfaces of the primary and secondary contact members, followed by a supplementary movement of the same support which has a component perpendicular to the said direction and which has the effect of self-cleaning said active surfaces, the mechanical means being adapted to act in the reverse direction before the extraction of the supports one from the other.

The or each primary contact member is preferably non-deformable. In that case, the non-deformable primary contact members may advantageously consist of the conducting tracks of a printed circuit board which thus constitutes one of the supports, the mechanical means acting on the support for the resilient secondary contact members.

It will be understood that the above-mentioned supplementary movement causes a sweeping effect which removes any insulating dust and therefore ensures a perfect passage for electric currents, even of low intensity.

It should be noted that in my U.S. patent application Ser. No. 665,864 filed Mar. 11th 1976, I have already proposed that a deformable secondary contact member should effect a movement approaching the active region of a non-deformable primary contact member, followed by a sweeping movement. But, in that case, the two supports are fixed in relation to one another during these two movements. A supplementary slide is provided, in which there is embedded the free end of the resilient contact member and the movement of which takes place in a single direction: the first part of this movement has the effect of deforming the resilient contact member in such a manner as to apply an intermediate region of this against a non-deformable contact member and the second part has the effect of displacing this intermediate region in relation to the non-deformable contact member. Thus this is essentially a different construction from that of the present invention.

Figure 2:
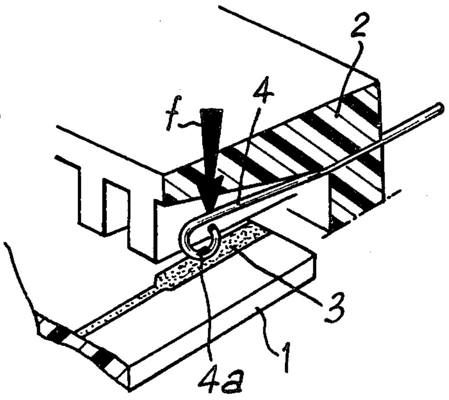
Figure 3:
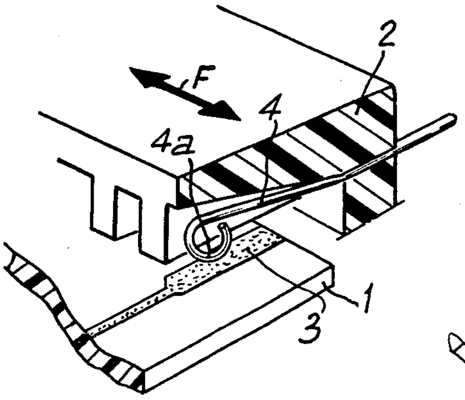
Figure 4:
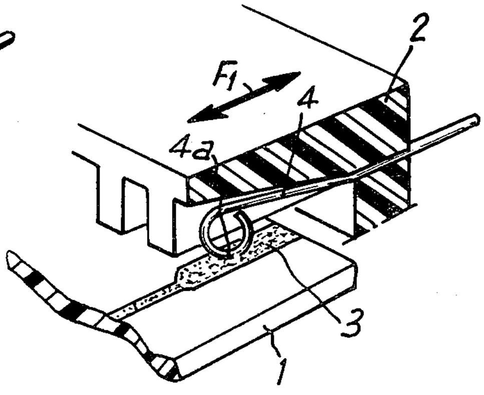
Figure 8:
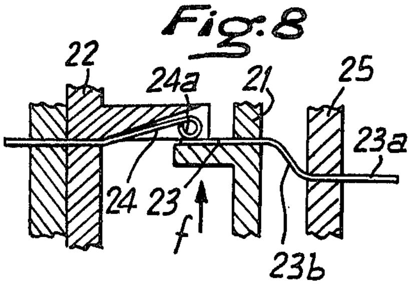
Figure 9:
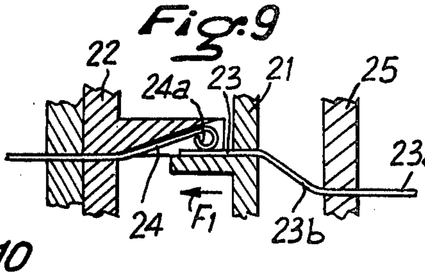
Figure 10:
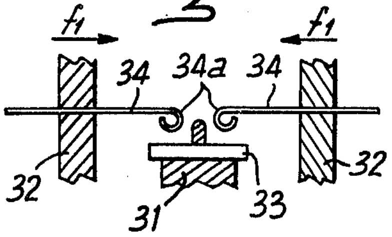
Figure 11:
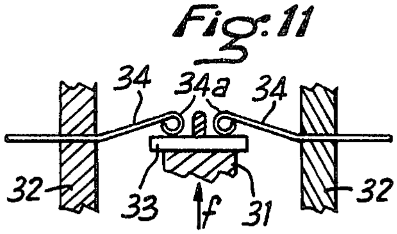
Figure 12:
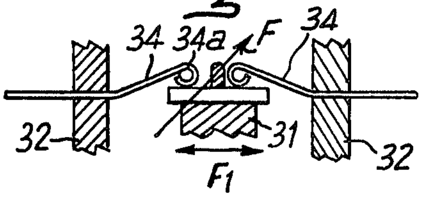
Figure 13:
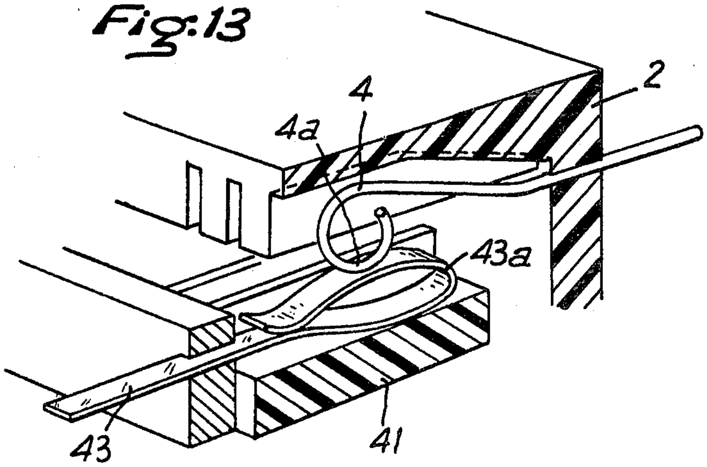

The invention will now be described, by way of example, with reference to the accompanying drawings, in which:

FIGS. 1 and 2 show, in diagrammatic cross-section, a connection device according to a first embodiment of the invention, in two successive positions of operation, FIG. 3 shows the device in a position of operation which follows those of FIGS. 1 and 2, FIG. 4 shows a modification of the device of FIGS. 1 and 2, FIGS. 5 and 6 illustrate mechanical means which may be incorporated in the connection device of FIGS. 1, 2 and 4, FIGS. 7, 8 and 9 show, in diagrammatic cross-section, a connection device according to a second embodiment of the invention, in three successive positions of operation, FIGS. 10, 11 and 12 show, in diagrammatic cross-section, a connection device according to a third embodiment of the invention, in three successive positions of operation, and FIG. 13 is a perspective view of a connection device according to a fourth embodiment of the invention.

Referring to the embodiment in FIGS. 1 to 3, the connection device comprises two rigid insulating supports 1 and 2, the support 1 being a printed circuit board. The support 2 is provided with guide surfaces (not shown) which enable the board 1 to be introduced into the support 2, parallel to the plane of the board 1, and to be extracted from the support 2. At one of its edges, the board 1 carries a number of non-deformable primary contact members or conducting tracks 3 (only one of which is illustrated). The support 2 carries an equal number of resilient secondary contact members 4, one end 4*a* of which is free for displacement substantially in a fixed direction (a direction parallel to that of the arrow f in FIG. 2 and perpendicular to the plane of the board 1) and is adapted to co-operate with one of the conducting tracks 3 of the board 1. The connection device also comprises mechanical means, represented diagrammatically by the arrow f in FIG. 2, which are adapted to displace the support 2 in relation to the other parallel to the direction defined above, once the board 1 has been introduced into the support 2, while the other support (or board) 1 is held fixed.

The mechanical means are so adapted as to cause the first movement of the movable support 2, parallel to the said direction and directed in the sense which moves the free ends 4*a* of the contact members 4 against the conducting tracks 3 (a movement symbolized by the arrow f and causing the elements of the device to pass from the position of FIG. 1 to that of FIG. 2), to be followed by a supplementary movement of this same support which has a component perpendicular to the said direction and which has the effect of self-cleaning the active surfaces 3, 4*a*.

According to the embodiment of FIG. 3, this movement, the above-mentioned component of which is symbolized by a double arrow F, is parallel to the edge of the board 1 on which the conducting tracks 3 are disposed. In the embodiment of FIG. 4, this movement, the corresponding component of which is symbolized by a double arrow $F_1$, is perpendicular to the above-mentioned edge. In both cases, the component F or $F_1$ is parallel to the plane of the board 1.

In order to bring the device of FIGS. 1, 2 and 3 or 4 into action, the board 1 is first introduced into the support 2, the board 1 and support 2 being mutually positioned so that the free ends 4*a* of the contact members 4 are spaced apart from the conducting tracks 3. Thus the two supports 1 and 2 come to occupy the position of FIG. 1. Then the support 2 is displaced in accordance with the arrow f in such a manner as to move the free ends 4*a* of the contact members 4 against the conducting tracks 3, as shown in FIG. 2. Finally, the support 2 is displaced either in accordance with the arrow F (FIG. 3) or in accordance with the arrow $F_1$ (FIG. 4), possibly combining this latter movement with a movement orientated in the direction of the arrow f. It is clear that the self-cleaning of the active surfaces of the contact members 3 and 4 is thus ensured.

Figure 5:
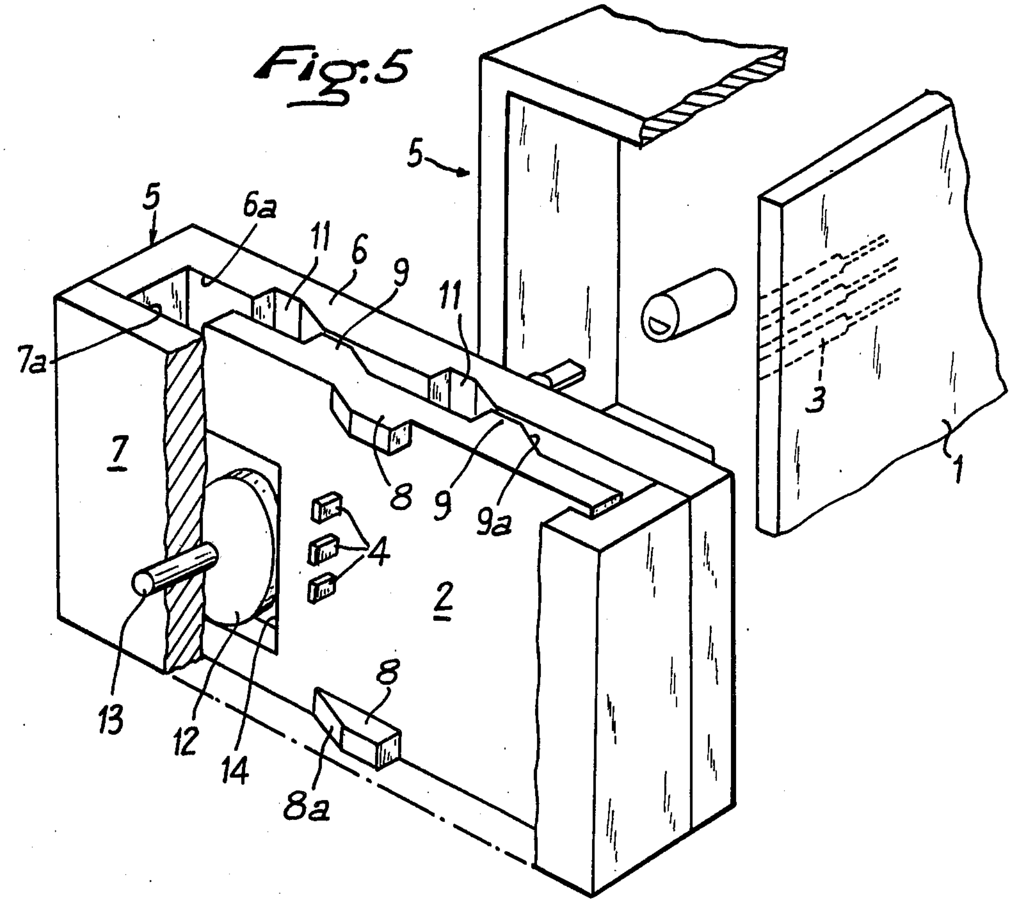
Figure 6:
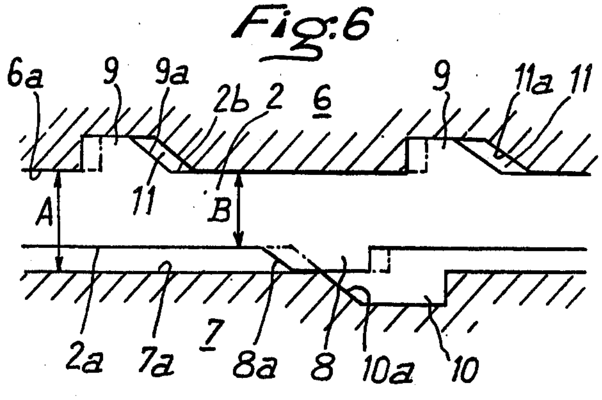

By way of example, mechanical means enabling the necessary movement to be imposed on the support 2 are shown diagrammatically in FIGS. 5 and 6. FIG. 5 shows the essential elements of the device in an exploded view. FIG. 6 shows some of the elements of FIG. 5 in profile.

The support 2 is mounted on a multiple-part frame 5 on which there are provided the guide surfaces permitting the introduction and extraction of the board 1. The frame 5 has two plates 6 and 7 of which the respective internal surfaces 6*a* and 7*a* are spaced apart by a distance A equal, apart from some play between the two components, to the thickness B of the support 2 (which is likewise in the form of a plate) plus the thickness either of cams 8 carried by the surface 2*a* of the support 2 which faces the surface 7*a* or of cams 9 carried by the opposite surface 2*b* of the support 2. The projecting cams 8 and 9 are bounded at one side by ramps 8*a* and 9*a* having the same inclination. On their surfaces 6*a* and 7*a*, the plates 6 and 7 have recesses 10 and 11 which are bounded at one side by ramps 10*a* and 11*a* parallel to the ramps 8*a* and 9*a*. The width of the recesses 10, 11 (measured horizontally in FIG. 6) is greater than that of the cams 8, 9. A control, for example with an eccentric 12 rigidly connected to an operating rod 13 and engaged in a window 14 of the support 2, enables the latter to be displaced in the direction of its length while leaving it free to be displaced in the direction of its thickness. In the position of FIG. 6, the top of the cams 8 rest on the surface 7*a* of the plate 7 while the cams 9 are engaged in their recesses 11. The support 2 is therefore in its forwardmost position and furthest to the left as seen in FIG. 6, which corresponds to the position of FIG. 1. By causing the cam 12 to rotate, the support 2 is displaced from left to right as seen in FIGS. 5 and 6. The tops of the cams 8 slide over the surface 7*a* and the surface 2*b* of the support 2 slides over the surface 6*a*. The support 2 is therefore displaced parallel to itself over a distance equal to the difference between the width of the recesses 10, 11 and that of the cams 8, 9, which corresponds to the passage from the position of FIG. 1 to that of FIG. 2. At the end of this movement, the ramps 8*a* arrive in the extension of the ramps 10*a* while the ramps 9*a* arrive in the extension of the ramps 11*a*. By continuing to cause the cam 12 to turn, therefore, the support is caused to advance obliquely towards the right and downwards in FIG. 6 as a result of the sliding of the ramps one on the other. Thus the support 2 is displaced both in accordance with the arrow $F_1$ of FIG. 4 and in accordance with the arrow f of FIG. 2. The result is a self-cleaning of the contact surfaces and an increase in the resilient contact pressure. Of course, if the cam 12 is caused to turn in the opposite direction, the operations described above are reproduced in the reverse order.

It goes without saying that the mechanical means illustrated in FIGS. 5 and 6 may be replaced by equivalent means permitting a final movement either in the direction of the arrow F (FIG. 3) or $F_1$ (FIG. 4) or in combination in the direction of the arrow F or $F_1$ and in the direction of the arrow f (FIG. 2).

Figure 7:
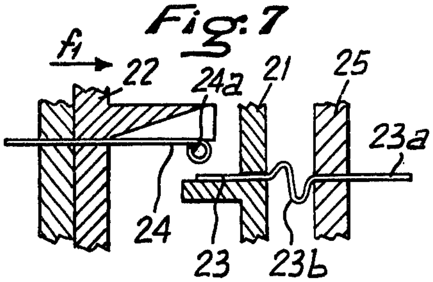

Referring now to the embodiment in FIGS. 7 to 9, the connection device comprises two rigid insulating supports 21 and 22 and a frame 25. The support 21 carries at least one non-deformable primary contact member 23 and the support 22 at lest one resilient secondary contact member 24, one end 24*a* of which is free for displacement parallel to the direction of the arrow f of FIG. 8 and is adapted to co-operate with the non-deformable contact member 23 which is visible in FIGS. 7 to 9. The frame 25 is provided with guide surfaces enabling the support 22 to be introduced in the direction of the arrow $f_1$ of FIG. 7, in a direction perpendicular to that of the arrow f. The device is also provided with mechanical means adapted to displace the support 21 in the direction of this arrow f, once the support 22 has been introduced into the device.

These mechanical means are so adapted as to cause the movement of the support 21 in accordance with the arrow f to be followed by a supplementary movement perpendicular to the direction of the arrow f, or at least having a component perpendicular to that direction. As FIG. 9 shows, these means are adapted in such a manner as to displace the support 21 in relation to the frame 25 in the direction of the arrow $F_1$ which is parallel and opposite to the arrow f. In order to facilitate the connection of each of the contact members 23 to external circuits, its rigid portion ends in a tail 23*a* which emerges from the frame 25. In this case, it is, of course, necessary to provide a flexibility fold **23*b* between the rigid portion of each contact member 23 and its tail 23*a*, to enable the support 21 to be displaced in relation to the frame 25 first in the direction of the arrow f, then in that of the arrow $F_1$. It will be readily understood that the movement of the support 21 in accordance with this latter arrow, from the position of FIG. 8 to that of FIG. 9, ensures the self-cleaning of the member 23 and of the end 24*a* of the member 24**, on their active surfaces.

In the embodiment of FIGS. 10 to 12, the connection device comprises a support 31 with a non-deformable primary contact member 33 and two symmetrical supports 32 each carrying a deformable secondary contact member 34. The free ends **34*a* of the two contact members 34 can be displaced in a direction parallel to that of the arrow f of FIG. 11 and co-operate with the same contact member 33. The device further comprises a frame similar to the frame 5 of FIG. 5 or frame 25 of FIGS. 7 to 9. This frame has guide surfaces permitting the introduction of the support 32 respectively in accordance with the arrow $f_1$ of FIG. 10. The device is provided with mechanical means which enable the support 31 to be displaced first in the direction of the arrow f of FIG. 11 (corresponding to the passage from the position of FIG. 10 to that of FIG. 11), then perpendicular to this arrow. Two possible ways of doing so are illustrated in FIG. 12**. The supplementary self-cleaning movement may take place either in accordance with the arrow $F_1$, parallel to the arrows $f_1$ indicating the introduction movement, or in accordance with the arrow F perpendicular to the arrows $f_1$.

In all the embodiments which have been described hitherto with reference to FIGS. 1 to 12, the primary contact member or members 3, 23 or 33 are non-deformable. It goes without saying that the invention likewise applies in the case where the primary contact members are resiliently deformable. This is illustrated in FIG. 13 which shows an embodiment differing from that of FIGS. 1, 2, 3 or 4 only in that the non-deformable primary contact member 3 is replaced by a deformable primary contact member 43 which is carried by a rigid support 41 and which co-operates through a loop **43*a* with the free end 4*a* of the deformable secondary contact member 4, the mutual movements of the supports 2 and 41 being the same as those of the supports 1 and 2 of the embodiments of FIGS. 1, 2 and 3 or FIGS. 1, 2 and 4**.

In all the embodiments illustrated the or each resilient secondary contact member 4, 24, or 34 may advantageously consist of a metal wire (or strip) the free end **4*a*, 24*a* or 34*a* of which is curved or wound to encourage the self-cleaning sliding on the primary contact member whether this is nondeformable (FIGS. 1 to 12) or deformable (FIG. 13**).

Whatever the embodiment, the displacement of the movable contact member may be obtained in two phases corresponding, on the one hand to the application of pressure and, on the other hand, to the displacement under a constant pressure as a result. It may likewise be combined in such a manner as to obtain a pressure which increases with the displacement.

I claim:

1. A separable electrical connection device comprising two rigid supports having guide surfaces enabling the supports to be introduced one inside the other and to be extracted one from the other, one of the supports carrying at least one primary contact member while the other carries at least one resilient secondary contact member one end of which is free for displacement substantially in a direction which is fixed in relation to its support and is adapted to co-operate with the or one of the primary contact members of the other support, and mechanical means for displacing one of the supports relative to the other parallel to the said direction while the other support is held fixed, after the supports have been introduced one inside the other, characterised in that the mechanical means are adapted to effect, after the supports have been introduced one within the other, a first movement of the support to be displaced, parallel to said direction and directed in the sense which effects engagement between active surfaces of the primary and secondary contact members, followed by a supplementary movement of the same support which has a component perpendicular to the said direction and which has the effect of self-cleaning of said active surfaces, the mechanical means being adapted to act in the reverse direction before the extraction of the supports one from the other.

2. An electrical connection device as claimed in claim 1, in which the or each primary contact member is non-deformable.

3. An electrical connection device as claimed in claim 2, in which the non-deformable primary contact members consist of the conducting tracks of a printed circuit board which constitutes one of the supports, the mechanical means acting on the support carrying the resilient secondary contact members.

* * * * *